(12) United States Patent
Fox et al.

(10) Patent No.: US 6,582,279 B1
(45) Date of Patent: Jun. 24, 2003

(54) APPARATUS AND METHOD FOR RECLAIMING A DISK SUBSTRATE FOR USE IN A DATA STORAGE DEVICE

(75) Inventors: Dennis L. Fox, Rochester, MN (US); James A. Hagan, Rochester, MN (US); John Patrick Hagen, Rochester, MN (US); Paul Henry Hanson, Rochester, MN (US); Theresa Marie Lewis, Oronoco, MN (US); Janice Blue Ostrom, Mazeppa, MN (US); Douglas Howard Piltingsrud, Eyota, MN (US); Steven F. Starcke, Rochester, MN (US); R. Paul Thicke, Stewartville, MN (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 0 days.

(21) Appl. No.: 10/093,169

(22) Filed: Mar. 7, 2002

(51) Int. Cl.$^7$ ................................................ B24B 1/00

(52) U.S. Cl. ........................... 451/37; 451/41; 451/54; 156/345.12

(58) Field of Search ............................. 451/37, 36, 41, 451/54, 104, 113, 262, 268, 57; 156/345.11, 345.12

(56) References Cited

U.S. PATENT DOCUMENTS

| | | |
|---|---|---|
| 4,645,561 A | 2/1987 | Rea |
| 5,340,370 A | 8/1994 | Cadien et al. |
| 5,527,423 A | 6/1996 | Neville et al. |
| 5,846,122 A * | 12/1998 | Graebner et al. ............. 451/28 |
| 5,846,398 A | 12/1998 | Caprio |
| 5,876,490 A | 3/1999 | Ronay |
| 6,015,506 A | 1/2000 | Streinz et al. |
| 6,166,885 A * | 12/2000 | Yamamoto et al. ......... 360/131 |
| 6,236,542 B1 | 5/2001 | Hartog et al. |
| 6,379,235 B1 * | 4/2002 | Halley ........................ 451/287 |

OTHER PUBLICATIONS

U.S. patent application Ser. No. 09/976,167, "Self–Cleaning Colloidal Slurry Composition and Process for Finishing a Surface of a Substrate", James A. Hagan et al., filed Oct. 12, 2001.

U.S. patent application Ser. No. 09/976,412, "Cleaning Polish Etch Composition and Process for a Superfinished Surface of a Substrate", James A. Hagan et al., filed Oct. 12, 2001. ROC9–2001–0283–US1).

U.S. patent application Ser. No. 09/590,667, "Lanthanide Oxide Dissolution from Glass Surface", Douglas Howard Piltingsrud, filed Jun. 8, 2000.

Product Information Sheet, "SRS 596 Specially Processed Cerium Oxide in an Aqueous Slurry", Ferro Electonic Materials, Penn Yan, New York, dated May 18, 2001 revision 1.

* cited by examiner

Primary Examiner—Joseph J. Hail, III
Assistant Examiner—Hadi Shakeri
(74) Attorney, Agent, or Firm—Grant A. Johnson; James R. Nock

(57) ABSTRACT

An apparatus and method of reclaiming a disk substrate. The cost of reclaiming a disk substrate can be lower, and the quality higher, than making a new one from a blank. A layer of a data storage disk is stripped, e.g., by acid/oxidizing bath immersion. The stripped disk is polished in a carrier between polishing pads, with the relative velocity of the polishing pads as seen by the disk being precisely controlled so that an equal amount of stock is removed from each side. Preferably, several stripped disks are sorted into groups based on disk thickness, and disks from one of the groups are simultaneously polished in the carrier. Sorting improves stock removal uniformity from disk to disk. The polished disks are cleaned and, preferably, ordered in a cassette for stacking in a storage device based on disk thickness to more easily meet a mean center specification.

20 Claims, 7 Drawing Sheets

APPARATUS AND METHOD FOR RECLAIMING A DISK SUBSTRATE FOR USE IN A DATA STORAGE DEVICE

FIELD OF THE INVENTION

The present invention relates in general to data storage systems. More particularly, the present invention relates to an apparatus and method for reclaiming a disk substrate for use in a data storage device.

BACKGROUND

A typical data storage device includes a medium for storing data, typically in magnetic, magneto-optical or optical form, and a transducer used to write and read data respectively to and from the medium. A disk drive data storage device, for example, includes one or more data storage disks coaxially mounted on a hub of a spindle motor. The spindle motor rotates the data storage disks at speeds typically on the order of several thousand or more revolutions-per-minute. Digital information, representing various types of data, is typically written to and read from the data storage disks by one or more transducers, or read/write heads, which are mounted to an actuator assembly and passed over the surface of the rapidly rotating disks.

In a typical magnetic disk drive, for example, data is stored on a magnetic layer coated on a disk substrate. Several characteristics of disk substrates significantly affect the areal density of a disk drive. One such characteristic that significantly affects the areal density of a disk drive is the uniformity of the surface of the disk substrate, i.e., the absence of substrate surface defects. It is generally recognized that minimizing the flyheight, i.e., the clearance distance between the read/write head and the surface of a data storage disk, generally provides for increased areal densities. It is also recognized in the art, however, that the smoothness of the surface of a data storage disk becomes a critical factor and design constraint when attempting to minimize the flyheight. A significant decrease in flyheight provided by the use of data storage disks having highly uniform recording surfaces can advantageously result in increased transducer readback sensitivity and increased areal density of the disk drive. The uniformity of disk substrate surfaces affects the uniformity of the recording surfaces because the layers sputtered onto the disk substrate, such as the magnetic layer, replicate any irregular surface morphology of the disk substrate.

Conventionally, disk substrates have been based upon aluminum, such as NiP coated Al/Mg alloy substrates. Coating the aluminum magnesium alloy with a nickel-phosphorus plate provides a harder exterior surface which allows the disk substrate to be polished and superfinished. A conventional superfinishing process and slurry is described in U.S. Pat. No. 6,236,542 to Hartog et al., which is assigned to the assignee of the present application. Typically, the Al/Mg—NiP substrate is superfinished to a smooth finish with a colloidal slurry, e.g., a pH adjusted aqueous slurry containing colloidal silica and/or colloidal alumina particles and an etching agent such as aluminum nitrate, prior to sputtering with thin film magnetic coatings. The colloidal alumina and silica slurries are then cleaned from the substrate by the general cleaning mechanisms of mechanical scrubbing, dispersion and etching. Surfactants and pH are generally used for dispersion cleaning, where the surfactant and pH act to separate the slurry particles from each other and from the substrate. Etching is generally accomplished by acids and acid soaps that erode or dissolve the substrate material beneath embedded slurry particles (under-cut) to release them from the substrate. Typical acids in use for NiP plated Al-based substrates include, for example, straight phosphoric acid, nitric acid, hydrofluoric acid-based soaps and phosphoric acid-based soaps. The straight acids generally have a pH less than 1 and the soaps generally have pH's above 1.

After cleaning, the substrates are sputtered with a series of layers, e.g., a chrome underlayer, a magnetic layer and a carbon protection layer. If residual slurry particles are left on the substrate or if there is galling to the relatively soft NiP layer, the sputtered layers replicate the irregular surface morphology, creating a bumpy surface on the finished disk. When the read/write head glides over the surface, it crashes into bumps created by the residual particles and/or damage that is higher than the glide clearance. This is known as a glide defect, which can ultimately cause disk drive failure. These bumps further cause magnetic defects, corrosion and decreased disk life. Thus, the residual slurry particles and/or damage needs to be removed from the superfinished substrate surface so that the substrate is as smooth as possible.

Unfortunately, aluminum-based substrates have relatively low specific stiffness, as well as relatively low impact and dent resistance. For example, the relatively low specific stiffness of the Al/Mg—NiP substrates (typically 3.8 Mpsi/gm/cc) makes this type of disk substrate susceptible to environmental forces which create disk flutter and vibration and which may cause the read/write head to impact and dent the disk substrate surface.

More recently, glass substrates have been used for disk drives in portable devices, such as laptop computers. Glass substrates have a higher impact and dent resistance than aluminum-based substrates, which is important in portable devices where the unit is subject to being bumped, dropped and banged around, causing the read/write head to bang on the disk substrate surface. Moreover, the specific stiffness of glass or glass-ceramic substrates (typically $\leq 6$ or 7 Mpsi/gm/cc) is typically higher than that of aluminum-based substrates.

An additional benefit of glass is that it is easier to polish to and maintain as a smooth surface finish (as compared to NiP) than aluminum-based substrates. A smoother substrate allows the read/write head to fly closer to the disk, which produces a higher density recording. Glide height for some computer disk drives is on the order of 20 nanometers (about 200 Å) and less, which is an extremely small interface distance. Thus, the fact that glass substrates can be polished to smoother finishes makes an industry shift from Al-based substrate s to glass substrates desirable, not only for disk drives used in portable devices, but for disk drives used in stationary devices as well.

The surface uniformity of glass substrates can still present a problem, however, especially for low glide heights (typically $\leq 20$ nanometers) and near contact recording. Just as with aluminum-based substrates, the surface of the glass substrate needs to be polished and superfinished with a slurry to provide an atomically smooth surface prior to sputtering. Such a conventional superfinishing polish process and slurry is also described in the above referenced U.S. Pat. No. 6,236,542 to Hartog et al. Typically, the glass substrate is superfinished to a smooth finish with a colloidal slurry, e.g., a pH adjusted aqueous slurry containing colloidal silica and/or colloidal alumina particles and an etching agent such as cerium sulfate, prior to sputtering with thin film magnetic coatings.

In this conventional superfinishing polish process colloidal silica particles attach to the surface being polished not only by the usual London dispersion forces, van der Waals forces and hydrogen bonding, but unlike NiP, also by molecular bonding even though the slurry has the usual stabilizing agents used in the colloidal silica to prevent the silica particles from sticking to each other (interparticle siloxane bonding), charge repulsion and/or steric stabilizers. Standard methods of scrubbing with soaps using polyvinyl alcohol (PVA) pads, ultrasonics or megasonics will not remove any significant percentage of such molecular bonded silica particles. Just as with aluminum-based substrates, if these particles are left in place on the glass substrate, glide defects occur that can ultimately cause disk drive failure. These glide defects further cause magnetic defects, corrosion and decreased disk life.

A less-than-optimal solution to this problem is to use stronger acid or base solutions than the cleaning soap, to etch the glass substrate or undercut the slurry particles similar to what can be done to remove hard alpha alumina from Al/Mg—NiP substrates after non-superfinish polish slurries. The surface finish of glass and NiP substrates are, however, damaged by such a technique by surface topography change such as pitting and chemical composition changes. Glass has low resistance to acid etching and overly aggressive acid solutions, such as hydrofluoric acid and caustic etching at high pH's and temperatures. Damage and compositional change to the superfinished glass surface will adversely affect the morphology of layers deposited by subsequent sputtering processes and can cause magnetic, glide and corrosion failures.

A better solution to this problem is to use a cleaning polish etch solution/process (a process performed by running disk substrates on a polishing pad using an etch solution instead of a slurry, i.e., there are no slurry particles in the cleaning polish etch solution) with acid, neutral or base solutions to etch the glass substrate and/or the attached slurry particles under polish conditions thereby maintaining the superfinish surface while removing the superfinish polish slurry debris by etching and dilution. Such a cleaning polish etch solution/process is disclosed in the copending application Ser. No. 09/976,412 entitled "CLEANING POLISH ETCH COMPOSITION AND PROCESS FOR A SUPERFFNISHED SURFACE OF A SUBSTRATE", assigned to the same assignee as the present application. Etching by itself (i.e., the first solution discussed above) with PVA scrub, ultrasonics or megasonics is what has been done to remove slurry particles from Al/Mg—NiP or glass substrates, but with the less than 20 nm glide heights now in use, a cleaning polish etch solution/process ensures 100% surface cleaning of particles that small (i.e., the lower the glide height, the smaller the particles needing to be removed, and thus the more difficult they are to remove) while maintaining the surface finish. The cleaning polish etch process, however, adds equipment and handling costs. Nonetheless, without the cleaning polish etch process the surface of the glass substrate can be damaged by using only chemical etch due to the low resistance of the glass material to acid etching or overly aggressive caustic etch solutions.

An even better solution to this problem is to use a self-cleaning colloidal slurry and process, such as disclosed in the copending application Ser. No. 09/976,167 entitled "SELF-CLEANING COLLOIDAL SLURRY COMPOSITION AND PROCESS FOR FINISHING A SURFACE OF A SUBSTRATE", assigned to the same assignee as the present application. The slurry comprises a carrying fluid, colloidal particles, etchant, and a surfactant adsorbed and/or precipitated onto a surface of the colloidal particles and/or substrate. The surfactant has a hydrophobic section that forms a steric hindrance barrier and substantially prevents contaminates, including colloidal particles, from bonding to the substrate surface. Subsequent cleaning with standard soap solutions removes substantially all remaining contamination from the substrate surface.

After cleaning, the glass substrate is typically subjected to chemical strengthening. Chemical strengthening is known in the art of treating glass. In chemical strengthening, the substrate is immersed in molten potassium nitrate and/or sodium nitrate for anywhere from 1 to 8 hours to strengthen the glass against breaking.

Effective techniques for polishing, cleaning and chemical strengthening can provide low glide yield losses and decreased disk drive failures. Nonetheless, because of the extremely large number of glass disks produced, even low glide yield losses and customer return rates dictate that a large number of glass disks are, or ultimately will be, rejected for various reasons including glide height, magnetic defects or disk drive failure. The inventors are not aware of any manufacturer in the disk drive industry that reclaims rejected glass disks. Huge quantities of rejected glass disks are merely discarded, adding to production costs and waste disposal demands.

If the market trend toward glass substrates in disk drives is to flourish, a mechanism for reclaiming rejected glass disks is required. Preferably, such a mechanism would improve production costs (as compared to discarding the rejected glass disk and making a new glass disk from a blank) and provide high quality glass disks.

SUMMARY OF THE INVENTION

An object of the present invention is to provide a mechanism of reclaiming a disk substrate for use in a data storage device.

Another object of the present invention is to provide a mechanism of reclaiming a disk substrate for use in a data storage device that improves production costs (as compared to discarding a rejected disk and making a new substrate from a blank) and provides a high quality disk.

These and other objects of the present invention are achieved by an apparatus and method of reclaiming a disk substrate for use in a data storage device. According to one aspect of the present invention, a disk substrate for use in a data storage device is reclaimed by stripping a data storage disk, polishing the stripped disk and cleaning the polished disk. According to another aspect of the present invention, an apparatus for polishing a disk substrate for use in a data storage device precisely controls the relative velocity of polishing pads as seen by the substrate so that a substantially equal amount of stock is removed from each side of the substrate.

In an exemplary embodiment, at least a portion of a layer (e.g., a sputtered magnetic recording layer) of a data storage disk is stripped by, for example, immersing the disk in an acid/oxidizing bath comprising water, hydrochloric acid and nitric acid. The stripped disk is polished (and preferably superfinished) in a carrier between an upper polishing pad and a lower polishing pad, with the relative velocity of the polishing pads as seen by the disk being precisely controlled so that an equal amount of stock is removed from each side of the disk. Because of the high level of stress in a chemically strengthened disk substrate, a side-to-side difference in the amount of stock removed will cause the disk substrate to have high curvature or out-of-flatness (a condition that renders the disk substrate useless and is often referred to as "coning"). Preferably, several stripped disks are sorted into groups based on disk thickness, and disks from one of the groups are simultaneously polished in the carrier. Sorting improves stock removal uniformity from disk to disk. The polished disks are cleaned and, preferably, ordered in a cassette for stacking in the data storage device based on disk thickness to more easily meet a mean center specification. A data storage disk for use in the data storage device may be provided by applying a recording layer over the surface of the polished disk.

The cost of reclaiming a disk substrate can be lower, and the quality higher, than making a new one from a blank. For example, the reclaimed disk substrate need not be subjected to a subsequent chemical strengthening process and an additional cleaning process thereafter. That is, the substrate of the rejected disk was already subjected to a chemical strengthening process prior to rejection of the disk and the chemical strengthening remains even after the disk substrate is recycled. In addition to reducing production costs, the elimination of subsequent chemical strengthening and cleaning processes means that the polished surface of the reclaimed disk substrate will not be degraded by adverse surface effects (e.g., pitting and asperities) that can be caused by the chemical strengthening process.

BRIEF DESCRIPTION OF THE DRAWINGS

The present invention together with the above and other objects and advantages can best be understood from the following detailed description of the embodiments of the invention illustrated in the drawings, wherein like reference numerals denote like elements.

DETAILED DESCRIPTION OF THE PREFERRED EMBODIMENTS

Overview

Figure 1:
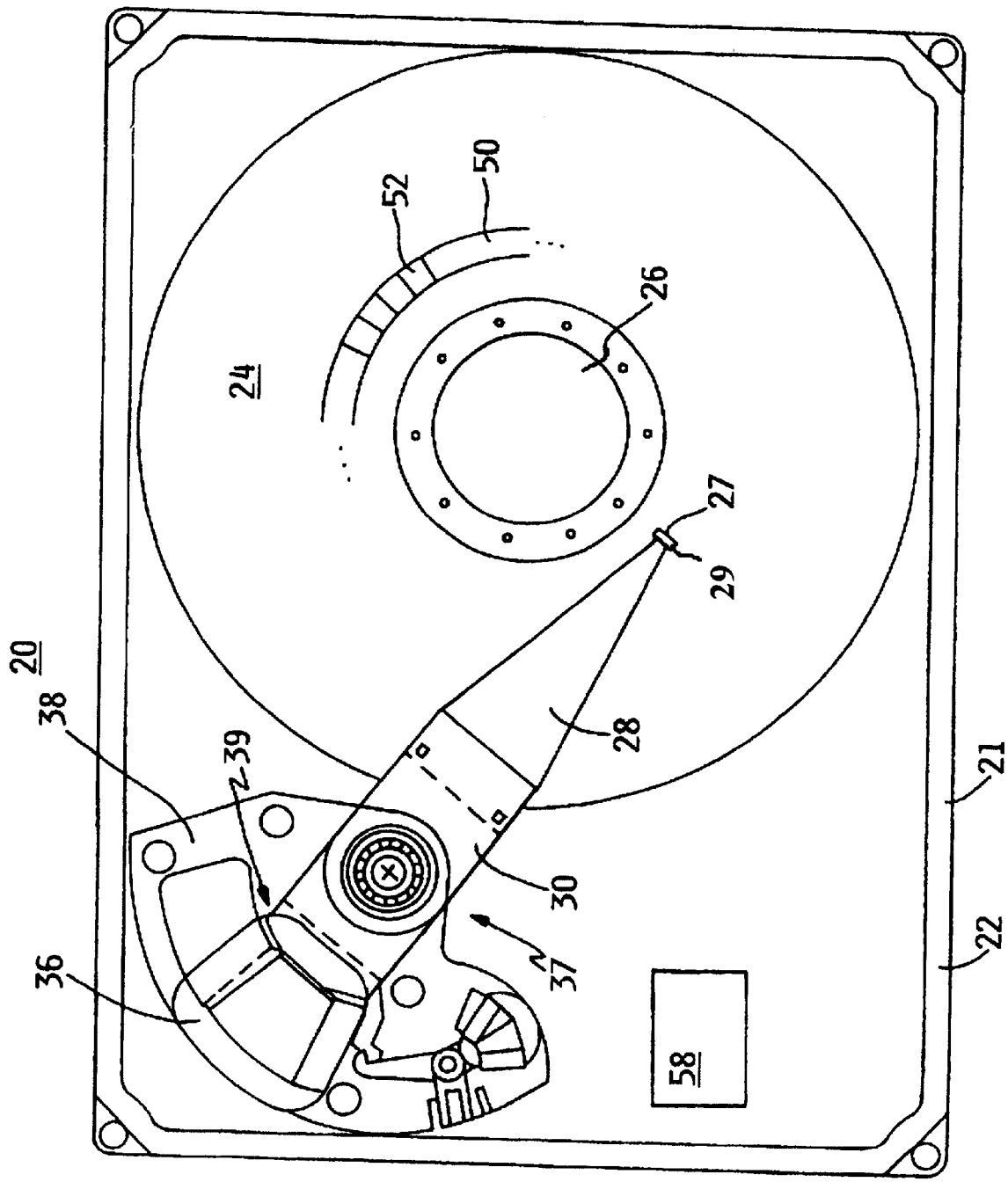
FIG. 1 is a top view of a data storage device with its upper housing cover removed and employing at least one data storage disk formed with a disk substrate that has been reclaimed in accordance with the present invention.

Effective techniques for the polishing, cleaning and chemical strengthening of glass disk substrates can provide low glide yield losses and decreased disk drive failures. Nonetheless, because an extremely large number of glass disks are produced, even low glide yield losses and customer return rates dictate that a large number of glass disks are, or ultimately will be, rejected for various reasons including glide height, magnetic defects or disk drive failure. The inventors are not aware of any manufacturer in the disk drive industry that reclaims rejected glass disks. Huge quantities of rejected glass disks are merely discarded, adding to production costs and waste disposal demands.

The present invention provides a solution to these problems. According to one aspect of the present invention, a disk substrate for use in a data storage device is reclaimed by stripping a disk, polishing the stripped disk and cleaning the polished disk. During polishing, it is necessary to precisely control the side-to-side stock removal so that substantially the same amount of stock is removed from each of the two surfaces of the stripped disk. Because of the high level of stress in a chemically strengthened disk substrate, a side-to-side difference in the amount of stock removed will cause the disk substrate to have high curvature or out-of-flatness (a condition that renders the disk substrate useless and is often referred to as "coning"). According to another aspect of the present invention, an apparatus for polishing a disk substrate for use in a data storage device precisely controls the relative velocity of upper and lower polishing pads as seen by the substrate so that a substantially equal amount of stock is removed from each side of the substrate.

In an exemplary embodiment, at least a portion of a layer (e.g., a sputtered magnetic recording layer) of a glass data storage disk is stripped by, for example, immersing the disk in an acid/oxidizing bath comprising water, hydrochloric acid and nitric acid. The stripped disk is polished (and preferably superfinished) in a carrier between an upper polishing pad and a lower polishing pad preferably using a self-cleaning colloidal slurry. The relative velocity of the polishing pads as seen by the disk is precisely controlled so that an equal amount of stock is removed from each side of the disk. Preferably, several stripped disks are sorted into groups based on disk thickness, and disks from one of the groups are simultaneously polished in the carrier. Sorting improves stock removal uniformity from disk to disk. The polished disks are cleaned and, preferably, ordered in a cassette for stacking in the data storage device based on disk thickness to more easily meet a mean center specification. When a self-cleaning colloidal slurry is used for polishing and superfinishing, cleaning with standard soap solutions removes substantially all remaining contamination from the surface of the polished disk. A data storage disk for use in the data storage device may be provided by applying a recording layer over the surface of the polished disk.

The cost of reclaiming a disk substrate can be lower, and the quality higher, than making a new one from a blank. For example, the reclaimed disk substrate need not be subjected to a subsequent chemical strengthening process and an additional cleaning process thereafter. That is, the substrate of the rejected disk was already subjected to a chemical strengthening process prior to rejection of the disk and the chemical strengthening remains even after the disk substrate is recycled. In addition to reducing production costs, the elimination subsequent chemical strengthening and cleaning processes means that the polished surface of the reclaimed disk substrate will not be degraded by adverse surface effects (e.g., pitting) that can be caused by the chemical strengthening process.

The Data Storage Device

Figure 2:
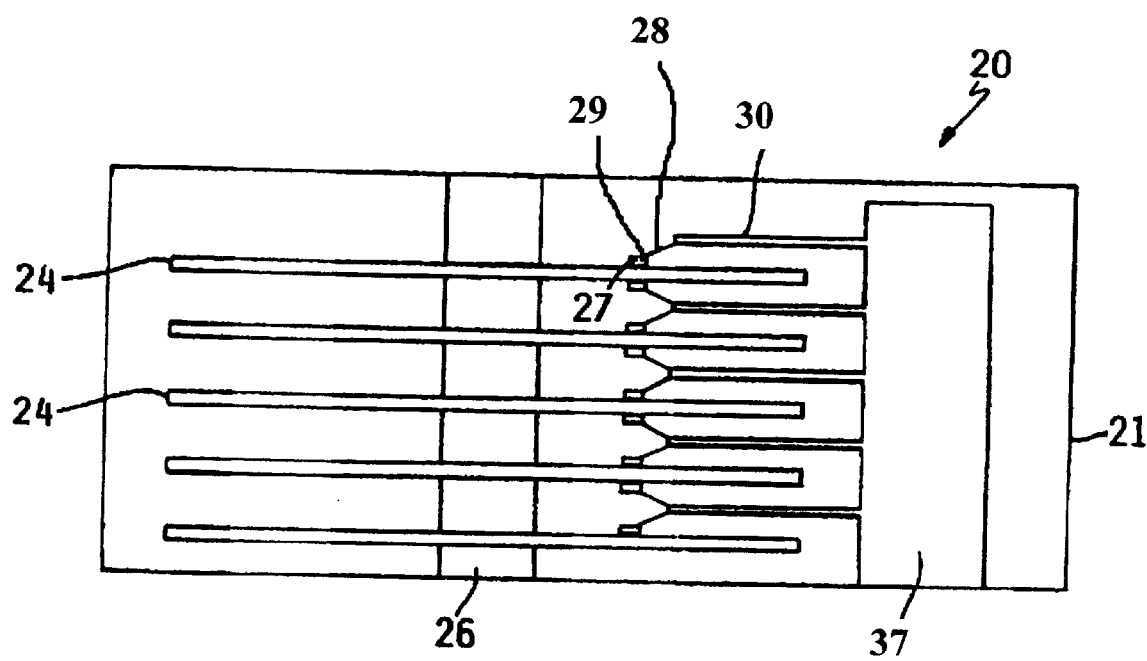
FIG. 2 is a side plan view of a data storage device comprising a plurality of data storage disks, at least one of which if formed with a disk substrate that has been reclaimed in accordance with the present invention.

Referring now to the drawings, and more particularly to FIGS. 1 and 2, there is shown a magnetic data storage device 20 utilizing magnetic disks, at least one of which is formed with a disk substrate that has been reclaimed in accordance the present invention. Magnetic data storage device 20 is shown in FIG. 1 with its cover (not shown) removed from a base 22 of a housing 21. As best seen in FIG. 2, the magnetic data storage device 20 includes one or more rigid data storage disks 24 that are rotated by a spindle motor 26. The rigid data storage disks 24 are constructed with a disk substrate upon which a recording layer is formed. At least one of the rigid data storage disks 24 is constructed with a disk substrate has been reclaimed in accordance with the present invention and upon which a recording layer is formed. In an exemplary construction, a magnetizable recording layer is formed on a glass disk substrate. Alternatively, an optical recording layer or a magneto-optical recording layer may be formed on the disk substrate in lieu of the magnetizable recording layer.

Referring back to FIG. 1, an actuator assembly 37 typically includes a plurality of interleaved actuator arms 30, with each arm having one or more suspensions 28 and transducers 27 mounted on airbearing sliders 29. The transducers 27 typically include components both for reading and writing information to and from the data storage disks 24. Each transducer 27 may be, for example, a magnetoresistive (MR) head having a write element and a MR read element. Alternatively, each transducer may be an inductive head having a combined read/write element or separate read and write elements, or an optical head having separate or combined read and write elements. The actuator assembly 37 includes a coil assembly 36 which cooperates with a permanent magnet structure 38 to operate as an actuator voice coil motor (VCM) 39 responsive to control signals produced by a controller 58. The controller 58 preferably includes control circuitry that coordinates the transfer of data to and from the data storage disks 24, and cooperates with the VCM 39 to move the actuator arms 30 and suspensions 28, to position transducers 27 to prescribed track 50 and sector 52 locations when reading and writing data from and to the data storage disks 24.

The Rejected Data Storage Disk & The Reclaimed Disk Substrate

A rejected data storage disk (from which a disk substrate that is to be reclaimed) may be a data storage disk that has been completed (i.e., having its full complement of layers covering the disk substrate, such as an underlayer, a magnetic recording layer and a protection layer) or a data storage disk that has not completed (i.e., having less than its full complement of layers covering the disk substrate). In the first case, a completed data storage disk may be rejected for various reasons including, for example, glide height, magnetic defects or disk drive failure. In the second case, a data storage disk that has not been completed may be rejected for various reasons including, for example, a deficiency in or failure of a process step (e.g., the coating of a glassy carbon or NiP underlayer, or the sputtering of a magnetic recording layer or a carbon protection layer), failing a test during or between process step(s), or contamination.

Figure 3:
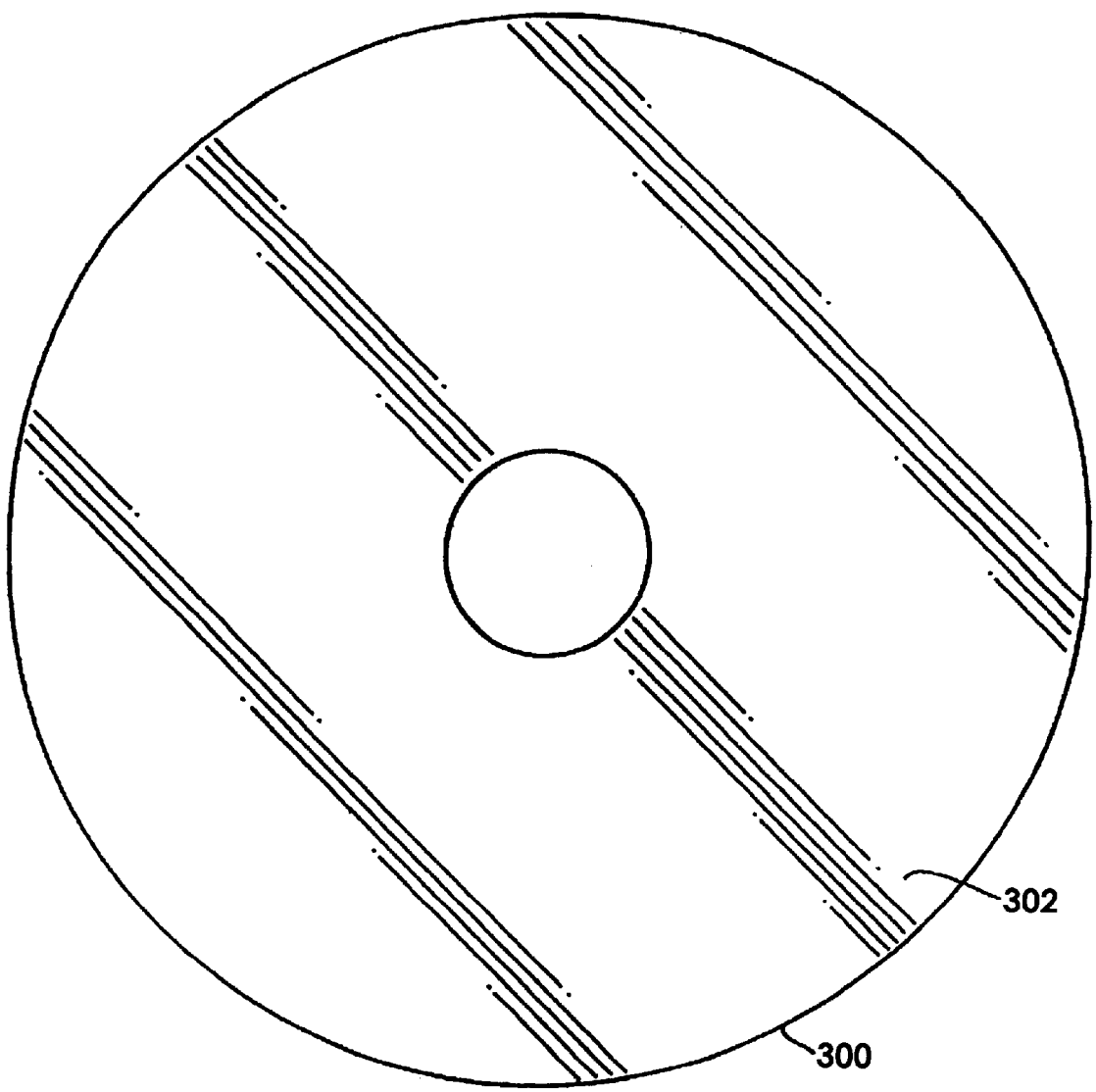
FIG. 3 is a perspective view of a disk substrate that has been reclaimed in accordance with the present invention.

FIG. 3 shows a disk substrate 300 that has been reclaimed from a rejected data storage disk by stripping the rejected disk and polishing/superfinishing the stripped disk using a self-cleaning colloidal slurry in accordance with the preferred embodiment of the present invention. However, the present invention is not limited to the use of the self-cleaning colloidal slurry of the preferred embodiment. Other conventional polishing and/or superfinishing slurries may be used consistent with the present invention including, for example, other colloidal slurries (both self-cleaning and otherwise), lanthanide oxide slurries (e.g., containing cerium oxide and/or lanthanum oxide) and the like. The disk substrate 300, which has a disk substrate surface 302, is preferably a material having a relatively high specific stiffness (e.g., $\geq 3.8$ Mpsi/gm/cc) such as a glass, glass-ceramic, ceramic, glass composite, metal or metal composite. More preferably, the disk substrate 300 is a glass, glass-ceramic or ceramic. Most preferably, the disk substrate 300 is an aluminosilicate glass. A common substrate material, e.g., aluminosilicate glass, has been chosen for the preferred embodiment to best illustrate the teachings of the present invention. However, it should be understood that the present invention is not limited to use of just aluminosilicate glass.

Any number of materials may be used for the disk substrate consistent with the present invention. Examples of materials that may be used as the disk substrate include alumina, sapphire, silicon carbide, boron carbide, metal matrix composites, and aluminium/boron carbide composites. Other examples of materials that may be used as the disk substrate include carbides, nitrides, oxides and phosphides or mixtures thereof. Still another example of a material that may be used as the disk substrate is a fiber reinforced composite such as graphite fiber reinforcement.

Metal matrix composites are made by pigmenting a metal, such as aluminum, with a ceramic powder. The mixture is then melted and formed into a disk substrate. The concentration of ceramic powder is balanced to provide optimal physical properties.

Other materials that may be fabricated into composites that may be used for the disk substrate include those such as silicon carbide, sapphire, titanium nitride, boron carbide, boron nitride, carbon, silicon nitride, as well as composites of glass and ceramic.

A representative list of compositions along with their relative specific stiffnesses (Mpsi/gm/cc) that may be used is found in Table 1 below.

TABLE 1

| Specific | Material Stiffness |
|---|---|
| Aluminum | 3.8 |
| Aluminosilicate glass | 4.9 |
| Lithium silicate glass | 5.2 |
| Canasite glass ceramic | 4.6 |
| Flint glass ceramic | 6.6 |
| Quartz glass | 4.9–6.1 |
| Titanium alloy | 3.3 |
| Zirconia | 5.1 |
| Alumina | 14.7 |
| Silicon carbide | 15.7–19.5 |
| Beryllium | 22.5 |
| Carbon | 2.2 |
| Alumina/aluminum composite | 5.3 |
| Boron carbide | 26.1 |
| Boron carbide/aluminum composite | 11.1–21.2 |

These materials may be used alone or in combination to provide the disk substrate of the appropriate stiffness. Preferably, the disk substrate has a stiffness of at least about 3.8 Mpsi/gm/cc.

Other useful materials for the disk substrate include glass compositions, ceramics, and mixtures thereof. Glass is generally a silicate material having a structure of silicon and oxygen where the silicon atom is tetrahedrally coordinated to surrounding oxygen atoms. Any number of materials may be used to form glass such as boron oxide, silicon oxide, germanium oxide, aluminum oxide, phosphorous oxide, vanadium oxide, arsenic oxide, antimony oxide, zirconium oxide, titanium oxide, aluminum oxide, thorium oxide, beryllium oxide, cadmium oxide, scandium oxide, lanthanum oxide, yttrium oxide, tin oxide, gallium oxide, indium oxide, lead oxide, magnesium oxide, lithium oxide, zinc oxide, barium oxide, calcium oxide, strontium oxide, sodium oxide, cadmium oxide, potassium oxide, rubidium oxide, mercury oxide, and cesium oxide.

Glass-ceramics may also be used for the disk substrate. Glass-ceramics generally result from the melt formation of glass and ceramic materials by conventional glass manufacturing techniques. Subsequently, the materials are heat cycled to cause crystallization. Typical glass-ceramics are, for example, β-quartz solid solution, $SiO_2$; β-quartz; lithium metasilicate, $Li_2O$—$SiO_2$; lithium disilicate, $Li_2(SiO_2)_2$; β-spodumene solid solution; anatase, $TiO_2$; β-spodumene solid solution; rutile $TiO_2$; β-spodumene solid solution; mullite, $3Al_2O_3$—$2SiO_2$; β-spodumene dorierite, $2MgO$—$2Al_2O_3$—$5SiO_2$; spinel, $MgO$—$Al_2O_3$; MgO-stuffed; β-quartz; quartz; $SiO_2$; alpha-quartz solid solution, $SiO_2$; spinel, $MgO$—$Al_2O_3$; enstatite, $MgO$—$SiO_2$; fluorphlogopite solid solution, $KMg_3AlSi_3O_{10}F_2$; mullite, $3Al_2O_3$—$2SiO_2$; and $(Ba, Sr, Pb)Nb_2O_6$.

Ceramics are generally comprised of aluminum oxides such as alumina, silicon oxides, zirconium oxides such as zirconia or mixtures thereof. Typical ceramic compositions include aluminum silicate; bismuth calcium strontium copper oxide; cordierite; feldspar, ferrite; lead lanthanum zirconate titanate; lead magnesium nobate (PMN); lead zinc nobate (PZN); lead zirconate titanate; manganese ferrite; mullite; nickel ferrite; strontium hexaferrite; thallium calcium barium copper oxide; triaxial porcelain; yttrium barium copper oxide; yttrium iron oxide; yttrium garnet; and zinc ferrite.

Aluminum-boron-carbide composite may also be used for the disk substrate, preferably with a ratio of aluminum to boron carbide (vol. %) ranging from about 1:99 to 40:60. The specific stiffness of these materials typically ranges from about 11.1 to 21.2 Mpsi/gm/cc. These disks are commonly referred to as aluminum-boron-carbide composites or AlBC composites.

Figure 4:
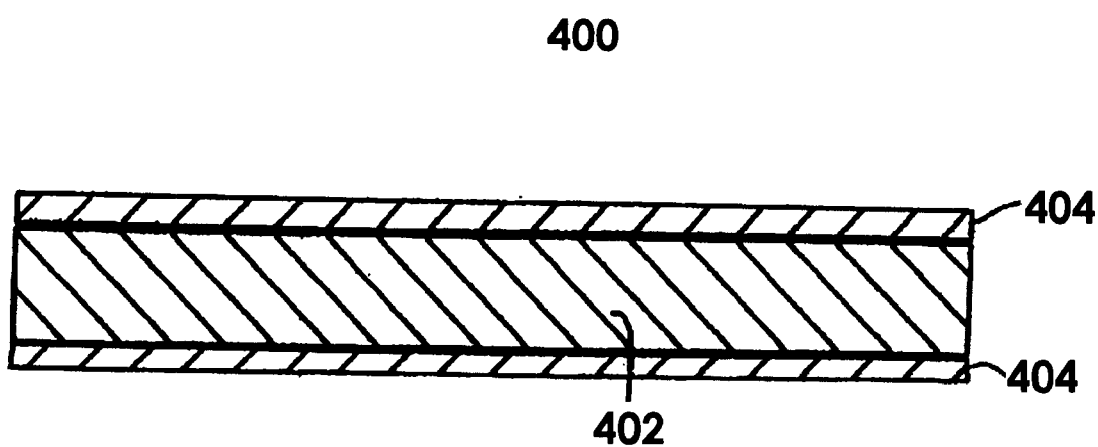
FIG. 4 is a cross-sectional view of a multi-layer disk substrate that has be en reclaimed in accordance with the present invention.

The reclaimed disk substrate may be made entirely of one material, or may include a coating layer applied over at least one surface of an inner core. Referring now to FIG. 4, which shows a cross section view of such a multi-layer disk substrate, a reclaimed disk substrate 400 comprises an inner core 402 and upper and lower coating layers 404. The inner core 402 is preferably made of a material having a relatively high specific stiffness, such as a glass, glass-ceramic, ceramic, glass composite, polymer, polymer composite, metal or metal composite. The coating layers 404 are preferably made of a material having a defect free surface, such as an NiP layer or a glassy carbon layer.

Stripping

At least a portion of a layer (e.g., a sputtered magnetic recording layer) of the data storage disk is stripped by, for example, immersing the disk in at least one bath containing at least one acid etchant and/or caustic etchant and/or oxidizer. Preferably, all of the layers are completely removed from the disk substrate. Useful acid etchants generally include inorganic acids such as nitric acid, nitrous acid, sulfuric acid, sulfurous acid, sulfamic acid, phosphoric acid, pyrophosphoric acid, phosphorous acid, perchloric acid, hydrochloric acid, chlorous acid, hypochlorous acid, hydrofluoric acid, carbonic acid, chromic acid, and combinations thereof. Of course, the acid etchant may also be an organic acid such as formic acid and citric acid. Useful caustic etchants generally include inorganic bases such as lithium hydroxide, sodium hydroxide, potassium hydroxide, calcium hydroxide, and ammonium hydroxide. Useful oxidants generally include oxidizers such as ozone, permanganates, bismuthates, cobalt III (e.g. cobalt sulfate), cerium IV (e.g. ammonium cerium IV nitrate or sulfate), nitric acid, dichromates, and the peroxo group containing $O_2^{2-}$ e.g. peroxydisulfates, periodic acid, periodates, perbromic acid, perbromates, perchloric acid, perchlorates and hydrogen peroxide. These oxidants are used in the appropriate acid, base or neutral solution as the oxidation potential/stability dictate and dissolution and/or etching needs require for a given composition of sputter layers. Any one or a combination of these etchants and oxidizers may be used is a single operation or successive operations. In an example of successive operations, the data storage disk is stripped with a caustic etchant and then with an acid etchant, or vice versa.

According to a preferred embodiment, a two bath stripping operation is used to completely remove the layers (i.e., a sputtered magnetic recording layer and a sputtered carbon protection layer) from a glass data storage disk having an aluminosilicate glass substrate. According to the preferred embodiment, the glass data storage disk is immersed in a first bath comprising a dilute aqua regia soak (e.g., about 75 vol. % DI water, about 20 vol. % hydrochloric acid and about 5 vol. % nitric acid) at room temperature for about 20 minutes. Then, according to the preferred embodiment, the glass data storage disk is immersed in a second bath comprising a dilute bleach/acid soak (e.g., about 90 vol. % DI water, about 5 vol. % bleach and about 5 vol. % hydrochloric acid) at room temperature for about 20 minutes. Following the two bath stripping operation, the stripped disk is rinsed free of sputter layer debris and is ready for polishing. It should be understood, however, that the optimal composition of the bath(s), as well as the temperature of the bath(s) and duration(s) of immersion, may at least partially depend on the composition of the disk substrate and layers that cover the substrate.

Sorting

Preferably, several of the disks are sorted into groups based on disk thickness, and at least some of stripped disks from one of the groups are simultaneously polished in a carrier of a polishing machine. The polishing machine and the polishing operation are discussed in the following section. Sorting improves stock removal uniformity from disk to disk. Typically, the thickness range of the rejected disks is too large to precision polish several stripped disks simultaneously on the same polishing machine without first performing a sorting operation. The sorting operation may be performed either before or after the stripping operation. A large thickness range coming into the polishing machine will cause a large side-to-side stock removal difference. Because of the high level of stress in chemically strengthened glass disks, for example, a side-to-side difference in stock removal will cause disks to have high curvature or out-of-flatness. To precision polish several stripped disks simultaneously on the same polishing machine, the stripped disks going into the polishing machine are sorted into thickness distribution groups, each group preferably having a range of thickness of about two microns. If, for example, the disk thickness specification is 1000 microns ±8 microns, the disks may be sorted into eight two-micron groups $G_1$–$G_8$, i.e., $992 \leq G_1 < 994$, $994 \leq G_2 < 996$, $996 \leq G_3 < 998$, $998 \leq G_4 < 1000$, $1000 \leq G_5 < 1002$, $1002 \leq G_6 < 1004$, $1004 \leq G_7 < 1006$, $1006 \leq G_8 \leq 1008$. It should be understood, however, that the thickness range of each group may be more or less than two microns. For example, selection of the optimal thickness range of each group may at least partially depend on the composition of the disk substrates and the required degree of equal stock removal. Only one group is simultaneously polished in the same polishing machine. As discussed in more detail in the following section, a group or groups containing the thinnest disks may be discarded so that the reclaimed disks will meet the low end of the disk thickness specification (i.e., the thickness of the disk substrate is reduced by the polishing operation). By sorting the disks into groups, the polishing operation will remove stock more uniformly from disk to disk throughout the polishing load. Sorting alone, however, does not guarantee equal stock removal on both sides of the disk.

Polishing/Superpolishing
Polishing Machine and Polishing Operation

Because of flatness problems associated with disk side-to-side stock removal, a precision double-sided polishing machine is required. The polishing machine of the preferred embodiment is a precision double-sided polishing machine that precisely controls the relative velocity of the polishing pads as seen by the substrate so that a substantially equal amount of stock is removed from each side of the substrate. As discussed in more detail below, the polishing machine preferably uses a controller and pin drive mechanism to precisely control carrier speed. This makes it possible to precisely change the relative linear velocity of the polishing pad on each side of the substrate. The relative velocity of the polishing pad as seen by the substrate is directly proportional to the stock removal from the side of the substrate in contact with the polishing pad. Accordingly, the stock removal for each side of the substrate can be made equal by adjusting the relative linear velocity of the polishing pad on each side of the substrate.

Alternatively, a conventional polishing machine may be used, but with inferior results due to the lack of sufficiently precise control of the relative velocity of polishing pads as seen by the substrate (i.e., the relative velocity control is not sufficiently precise to allow removal of a substantially equal amount of stock from each side of the substrate). An example of a conventional polishing machine that may be used is a three motor, 9B-5P SpeedFam Double-Sided Polishing Machine made by SpeedFam Corporation.

The polishing machine preferably has a controller that precisely controls the speed of the carrier through a pin drive mechanism. Preferably, the lower polishing pad is stationary and the upper polishing pad is rotated at a predetermined speed. The carrier is rotated and orbited between a sun gear and a ring gear. The controller precisely controls the speed of rotation of the sun gear and/or the ring gear so that the relative velocity of the upper polishing pad as seen by the substrate is substantially equal to the relative velocity of the lower polishing pad as seen by the substrate. This precise control of carrier speed allows a substantially equal amount of stock to be removed from each side of the substrate.

Figure 5:
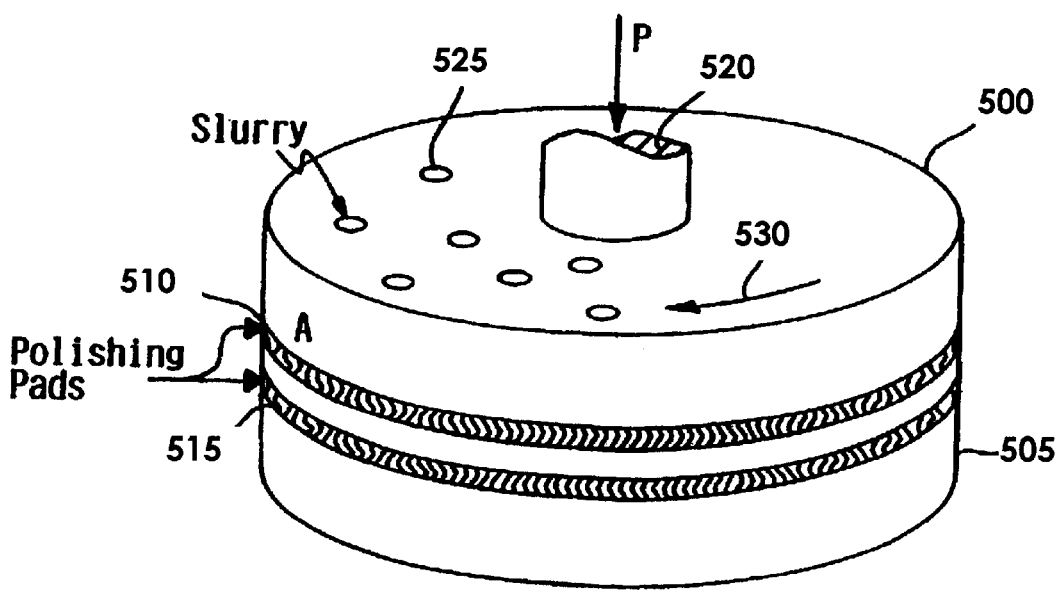
FIG. 5 shows how an upper polishing pad operates in relation to a stationary lower polishing pad of the preferred embodiment to generate polishing action.

The double-sided polishing action of the polishing machine is shown in FIG. 5. Individual disk substrates are held between polishing pads 510 and 515 by polishing plates 500 and 505. The polishing pads used in the preferred embodiment are Napcon H7000SPH#2 polishing pads made by Fujibo; however, other polishing pads with similar characteristics could also be used. While pressure is applied axially to shaft 520, upper polishing plate 500 and attached upper polishing pad 510 are rotated in a clockwise direction (shown by rotation arrow 530) and lower polishing plate 505 and attached lower polishing pad 515 are stationary. Alternatively, upper polishing plate 500 and attached upper polishing pad 510 may be rotated in a counterclockwise direction. Rather than being stationary as in the preferred embodiment, lower polishing plate 505 and attached lower polishing pad 515 may be rotated, either in the same direction as upper polishing plate 500 or in the opposite direction. The pressure applied to shaft 520 typically should be set to approximately 0.7–1.5 psi-disk (pounds per square inch of disk area). Upper polishing plate 500 and attached polishing pad 510 typically should be set to rotate at about 30–58 RPM. It should be understood, however, that the preferred values of the axially applied pressure and polishing pad RPM may at least partially depend on variables such as the type of polishing pads, the composition of the disk substrate and the composition of the slurry. For example, if a self-cleaning colloidal slurry in accordance with the preferred embodiment is used, the speed of the upper polishing pad is preferably about 35 RPM and the axial applied pressure is preferably about 1.0 psi-disk. If, on the other hand, a lanthanide oxide slurry is employed, the speed of the upper polishing pad is preferably about 58 RPM and the axial applied pressure is preferably about 1.5 psi-disk.

Slurry supply ports, such as slurry supply ports 525, are used in introducing the slurry onto the disk substrates. As a result of this double-sided polishing action, both the top and bottom sides of the disk substrates are polished simultaneously and a nearly identical amount of stock material is removed from both the top and bottom sides of the disk substrates. In addition, this double-sided polishing action makes it possible for the reclaimed substrates to meet finished disk requirements. The reclaimed substrates may, for example, have very low roughness, low waviness and low roll-off.

Figure 6:
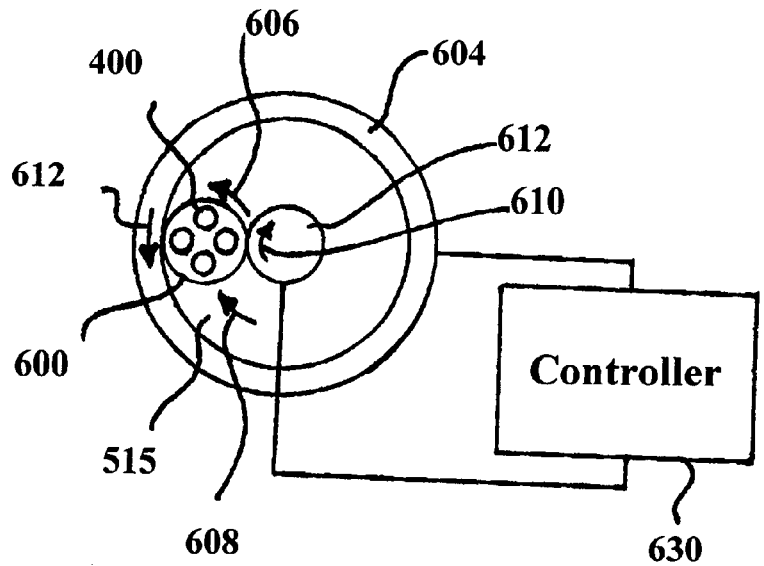
FIG. 6 shows how a disk substrate carrier under the speed control of a controller operates in relation to the stationary lower polishing pad of the preferred embodiment to generate polishing action.
Figure 8:
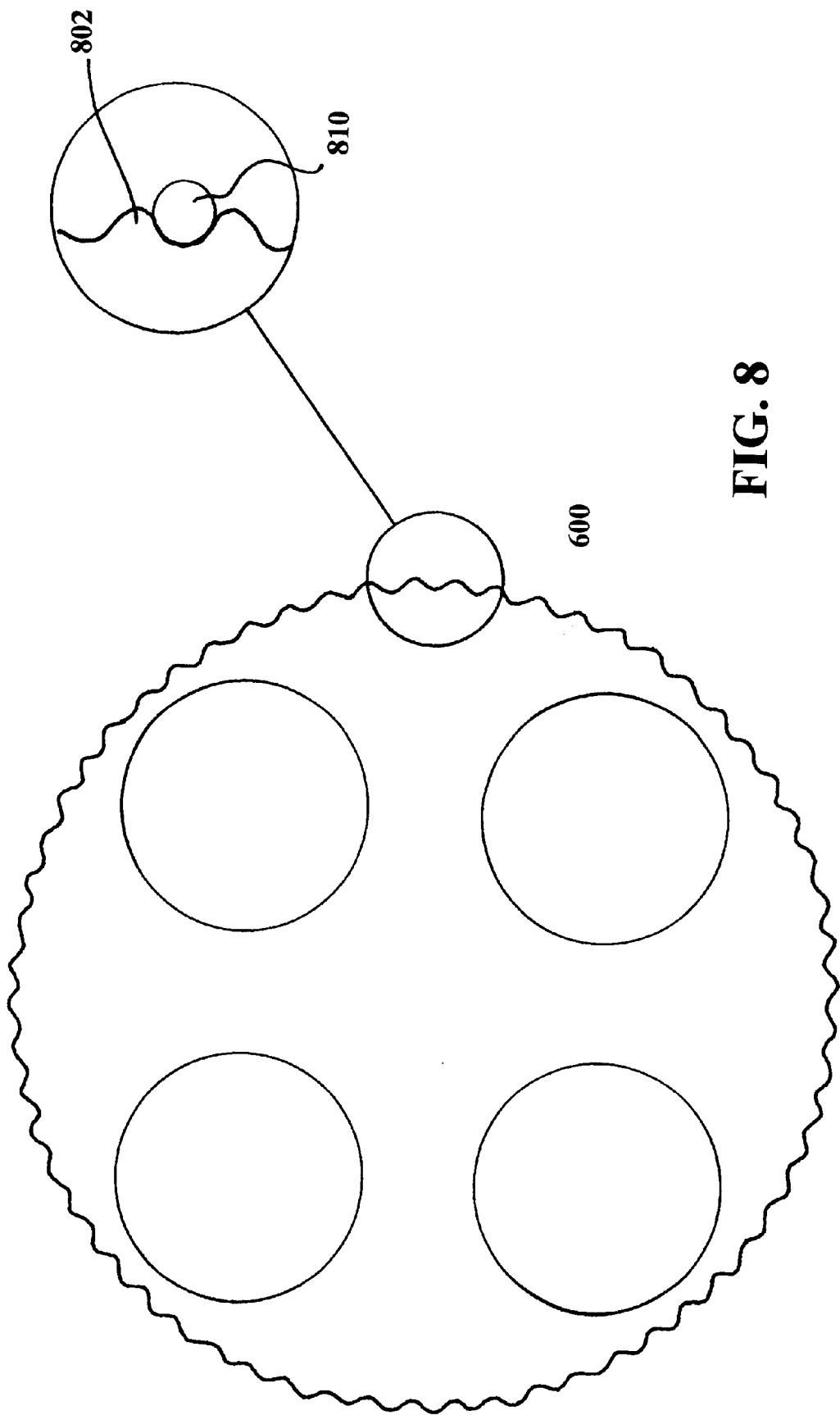
FIG. 8 shows how a disk substrate carrier of the preferred embodiment is driven by a pin drive mechanism.

FIG. 6 shows how the disk substrate carriers, such as disk substrate carrier 600, operate in relation to lower polishing pad 515 and upper polishing pad 510 (not shown). The carrier 600 is rotated and orbited between a sun gear 602 and a ring gear 604. In the embodiment wherein the upper polishing pad 510 is rotated in the clockwise direction and the lower polishing pad is stationary, disk substrate carrier 600 rotates (shown by arrow 606) in a counterclockwise direction and orbits (shown by arrow 608) in a clockwise direction. To accomplish this, sun gear 610 is rotated (shown by arrow 610) in a clockwise direction by one motor (not shown) and ring gear 620 is rotated (shown by arrow 612) in a counterclockwise direction by another motor (not shown). A controller 630 precisely controls the speed of carrier 600 by controlling the speed of rotation of drive sun gear 602 and/or the speed of rotation of ring gear 604, which preferably drive carrier 600 through a pin drive mechanism. As best seen in FIG. 8, the pin drive mechanism includes a series of pins 810 (one shown) that are mounted on both the sun gear and the ring gear and that mesh with a series of gear teeth 802 (formed on the periphery of disk substrate carrier 600).

Referring back to FIG. 6, controller 630 precisely controls the speed of rotation of sun gear 602 and/or the speed of rotation of ring gear 604 so that the relative velocity of upper polishing pad 510 (not shown in FIG. 6) as seen by substrate 400 is substantially equal to the relative velocity of lower polishing pad 515 as seen by substrate 400. The controller 630 may, for example, be a conventional programmable motor speed controller that permits the operator to program and adjust the RPM of one or more motors—in this case, the RPM of the motor that drives the sun gear 602 and/or the RPM of the motor that drives the ring gear 604. Precise control of the speed of carrier 600 allows a substantially equal amount of stock to be removed from each side of substrate 400. As noted earlier, disk substrate carrier 600 rotates (shown by arrow 606) in a counterclockwise direction and orbits (shown by arrow 608) in a clockwise direction. As also noted earlier, upper polishing plate 500 and attached upper polishing pad 510 (neither of which is shown in FIG. 6) are rotated in a clockwise direction (i.e., the same direction in which carrier 600 orbits), while lower polishing plate 505 (not shown in FIG. 6) and attached lower polishing pad 515 are stationary.

Figure 7:
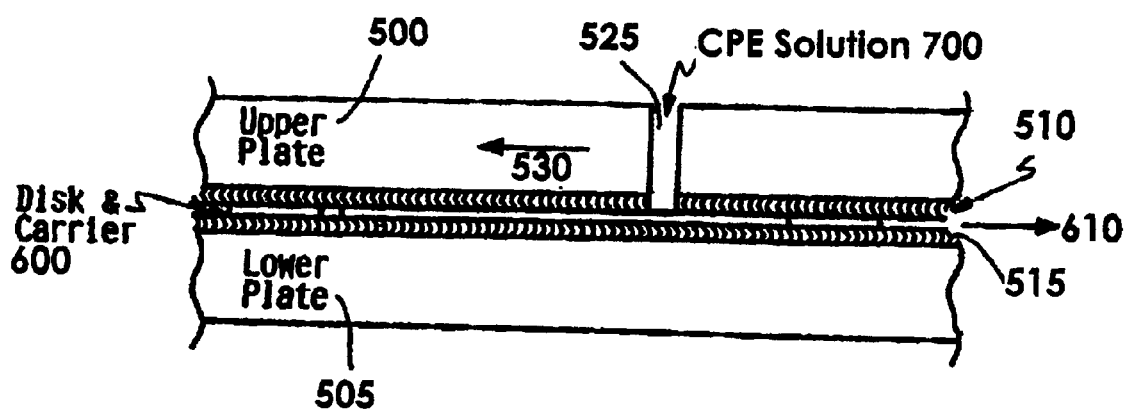
FIG. 7 shows how a colloidal slurry is introduced onto the stripped disk during polishing in accordance with the present invention.

FIG. 7 shows how self-cleaning colloidal slurry 700 is introduced onto disk substrates during polishing. However, as noted earlier the present invention is not limited to the use of the self-cleaning colloidal slurry of the preferred embodiment. Other conventional polishing and/or superfinishing slurries may be used consistent with the present invention including, for example, other colloidal slurries (both self-cleaning and otherwise), lanthanide oxide slurries (e.g., containing cerium oxide and/or lanthanum oxide) and the like. As soon as the polishing operation is begun, slurry 700 is introduced onto disk substrates via slurry supply ports like slurry supply port 525. Slurry 700 is introduced onto disk substrates at a rate of 100 ml per minute. Slurry 700 then depolymerizes (e.g., breaks silicon oxygen bonds in the case of an aluminosilicate glass disk substrate) the surface of the disk substrates (not shown) located in disk substrate carrier 600. As slurry 700 depolymerizes the disk substrate material, it is removed from the disk substrate by the polishing action of the slurry 700 and the polishing pads 510 and 515. Under the above process parameters, the polishing time is less than or equal to 12 minutes plus rinse. Preferably, a total of about 2 microns of stock is removed from each disk substrate, i.e., about 1 micron of stock is removed from each side. Near the end of the polishing operation, rinse water should be introduced onto the disk substrates to start slurry 700 removal off the disk substrate. Too short of a rinse time adds cleaning load to the downstream cleaning process. In the preferred embodiment, a rinse of 60 seconds is used.

Cleaning

Soap-Based Cleaning Process

After coming off the polisher, the disk substrates 400 are subjected to a conventional soap-based cleaning process. For example, the disk substrates 400 may be ultrasonically cleaned with soap and/or mechanically scrubbed (Oliver scrub cleaning) using soap and a pad. When used in conjunction with a slurry that is not self-cleaning, such conventional soap-based cleaning processes leave residual slurry material that must be removed from the surface of the disk substrates by a further cleaning mechanism as discussed in more detail below. However, when used in conjunction with the self-cleaning colloidal slurry 700, such conventional soap-based cleaning processes completely remove the remaining slurry material leaving the surface of the disk substrates 400 free from contamination. An example of a suitable conventional soap-based cleaning process is set forth in Table 2 below.

TABLE 2

| Step # | Cleaning Process for Superfinished Disk Substrates |
| --- | --- |
| 1. | Place substrate in receiving tray/holding tub used to unload substrate off polisher (no more than 4 hrs.). Receiving tray/holding tray/holding tub contains 0.2% Corsheen 9192LF available from Coral Chemical Co., Paramount CA + 0.1% $H_2O_2$ in deionized (DI) water at room temperature (RT). |
| 2. | Subject substrate to 40 kHz ultrasonics (US) with 2.5% Corsheen 9192LF + 0.05% $H_2O_2$ in DI water for 5 min. at 63 C. |
| 3. | Place substrate in holding tub (no more than 4 hrs.). Holding tub contains 0.2% Corsheen 9192LF + 0.1% $H_2O_2$ in DI water at RT. |
| 4. | Subject substrate to 7 sec. Oliver scrub with 2.5% Corsheen 9192LF + 0.05% $H_2O_2$ in DI water at RT. |
| 5. | Place substrate in holding tub (no more than 4 hrs.). Holding tub contains 0.2% Corsheen 9192LF + 0.1% $H_2O_2$ in DI water at RT. |
| 6. | Places substrate in SpeedFam Neptune Cleaner available from SpeedFam Corp.:<br>Input conveyer with 0.2% Corsheen 9192LF + 0.1% $H_2O_2$ in DI water at RT;<br>First US cleaning tank with 0.2% Corsheen 9192LF + 0.1% $H_2O_2$ in DI water at 53 C. for 3.5 min.;<br>DI rinse for 2 min.;<br>Polyvinyl alcohol (PVA) scrub with (pH 10.5) KOH + 0.05% $H_2O_2$ in DI water for 12–14 sec. at RT;<br>3 DI rinses, each for 3.5 min.;<br>37% isopropyl alcohol (IPA)/DI US clean and spin dry for 3.5 min. |

Further Cleaning Mechanism

As noted above, when a slurry is used that is not self-cleaning, a further cleaning mechanism must typically be used. In the case of a colloidal slurry that is not self-cleaning, one such further cleaning mechanism that may be employed is the use of stronger acid or base solutions than the cleaning soap, to etch the glass substrate or undercut the slurry particles similar to what can be done to remove hard alpha alumina from Al/Mg—NiP substrates after non-superfinish polish slurries. The surface finish of glass and NiP substrates are, however, damaged by such a technique by surface topography change such as pitting and chemical composition changes. Glass has low resistance to acid etching and overly aggressive acid solutions, such as hydrofluoric acid and caustic etching at high pH's and temperatures. Damage and compositional change to the superfinished glass surface will adversely affect the morphology of layers deposited by subsequent sputtering processes and can cause magnetic, glide and corrosion failures.

Another such further cleaning mechanism that may be employed in the case of a colloidal slurry that is not self-cleaning is the use of a cleaning polish etch solution/process (a process performed by running disk substrates on a polishing pad using an etch solution instead of a slurry, i.e., there are no slurry particles in the cleaning polish etch solution) with acid, neutral or base solutions to etch the glass substrate and/or the attached slurry particles under polish conditions thereby maintaining the superfinish surface while removing the superfinish polish slurry debris by etching and dilution. Such a cleaning polish etch solution/process is disclosed in the copending application Ser. No. 09/976,412 entitled "CLEANING POLISH ETCH COMPOSITION AND PROCESS FOR A SUPERFINISHED SURFACE OF A SUBSTRATE", assigned to the same assignee as the present application, and incorporated herein by reference. Etching by itself (i.e., the first further cleaning mechanism discussed above) with PVA scrub, ultrasonics or megasonics is what has been done to remove slurry particles from Al/Mg-NiP or glass substrates, but with the less than 20 nm glide heights now in use, a cleaning polish etch solution/process ensures 100% surface cleaning of particles that small (i.e., the lower the glide height, the smaller the particles needing to be removed, and thus the more difficult they are to remove) while maintaining the surface finish. The cleaning polish etch process, however, adds equipment and handling costs. Nonetheless, without the cleaning polish etch process the surface of the glass substrate can be damaged by using only chemical etch due to the low resistance of the glass material to acid etching or overly aggressive caustic etch solutions.

In the case of lanthanide oxide slurries (e.g., containing cerium oxide and/lanthanum oxide), another such further cleaning mechanism is dissolution by immersion of the substrate into an acid bath containing nitric acid, hydrogen peroxide and an organic acid having a carboxylic acid group. Dissolving the slurry particles breaks the molecular bonding, the surface compliance, and size factors similar to under-cutting, but without the surface-altering etch. Subsequently, as is typical in the industry, the substrate is also PVA (polyvinyl alcohol) pad scrubbed with a basic soap solution. Advantageously, the substrate is further immersed in a basic bath of potassium hydroxide. Such a dissolution-based cleaning mechanism is disclosed in the copending application Ser. No. 09/590,667 entitled "LANTHANIDE OXIDE DISSOLUTION FROM GLASS SURFACE", assigned to the same assignee as the present application, and incorporated herein by reference.

Subsequent Processing

After being cleaned, the reclaimed disk substrates 400 may be further processed and finished by any other means known to those of skill in the art. After cleaning, for example, the reclaimed disk substrates 400 may be sputtered with a series of layers, e.g., a magnetic layer and a carbon protection layer, using any of the various techniques that are conventional in the art.

The polishing operation will cause the mean center of the thickness distribution of the reclaimed disk substrates 400 to shift downward (as compared to disk substrates that are not reclaimed) because of the additional stock removal. If unaddressed, this shift in the mean center thickness distribution may cause disk drive stacking tolerance problems. It is desirable, therefore, to follow a set of ordering procedures for some thickness groups. That is, to more easily meet the mean center specification, the reclaimed disk substrates 400 are preferably ordered in a cassette for stacking in the data storage device using a set of ordering procedures that are based on disk thickness. The disks are preferably stacked in this same ordered relationship in the data storage device. Preferably, the set of ordering procedures re-centers the thickness distribution of the reclaimed disk substrates 400 even though stock removal has taken place. The following set of ordering procedures is based on a stock removal of two microns. This will permit reclaiming about 75% of the incoming rejects at polish and yet meet the mean center specification (e.g., thickness specification of 1000 ±8 microns, with a mean center specification of 1000 ±2.8 microns.) It should be understood, however, that the following set of ordering procedures is set forth for the purpose of illustration and not limitation. Other ordering procedures may be used consistent with the present invention, including those based on a stock removal of other than two microns, other thickness specifications and other mean center specifications.

TABLE 3

| Disk Thickness Cell Before Polish (microns) | Thickness After Polish (microns)/ In Spec. For Mean Center of Thickness Distribution | Thickness After Polish (microns)/ Polisher/Load Into Odd Cassette Positions | Thickness After Polish (microns)/ Even Polisher/ Load Into Even Cassette Positions |
|---|---|---|---|
| 1007 to 1008 | | | 1005 to 1006 (Cell A) |
| 1005 to 1006 | | | 1003 to 1004 (Cell B) |
| 1003 to 1004 1002 | 1001 to 1002 1000 | | |
| 1001 to 1000 998 to 999 | 998 to 999 | | |
| | | 997 to 996 (Cell C) | |
| 996 to 997 | | 994 to 995 (Cell D) | |
| 992 to 995 (Scrap) | | | |

The "even polisher" in TABLE 3 polishes disks on the high side of the thickness specification. For example, disks sorted to a thickness of 1007 to 1008 microns before polish will have a thickness of 1005 to 1006 microns (Cell A) after being polished in the "even polisher" (i.e., stock removal=2 microns). Likewise, disks sorted to a thickness of 1005 to 1006 microns before polish will have a thickness of 1003 to 1004 microns (Cell B) after being polished in the "even polisher". The reclaimed disks that are polished in the "even polisher" are loaded into even positions of a cassette. That is, the odd positions of the cassette (between the even positions) remain unloaded. For example, a sequence of four positions in the cassette may partially filled with reclaimed disks of the following cells, . . . /A/ /B/ / . . . .

The "odd polisher" in TABLE 3 polishes disks on the low side of the thickness specification. For example, disks sorted to a thickness of 998 to 999 microns before polish will have a thickness of 996 to 997 microns (Cell C) after being polished in the "odd polisher" (i.e., stock removal=2 microns). Likewise, disks sorted to a thickness of 996 to 997 microns before polish will have a thickness of 994 to 995 microns (Cell D) after being polished in the "odd polisher". The reclaimed disks that are polished in the "odd polisher" are loaded into odd positions of the cassette already partially loaded from the "even polisher", thereby completely filling the cassette. For example, the sequence of four positions in the cassette referred to above may now be completely filled with reclaimed disks of the following cells, . . . /A/C/B/D/ . . . . By so combining the reclaimed disks on the low side of the thickness specification with the reclaimed disks on the high side in the cassette for stacking in the data storage device, the mean center specification can easily be met. That is, the disks are preferably stacked in this combined ordered relationship in the data storage device.

Composition of Self-Cleaning Colloidal Slurry 700 Etching Agents and pH

The chemical polishing portion of this chemical-mechanical process is achieved through the use of an etching agent. If disk substrate 400 is glass, for example, metal etchant such as Ce, Zr, Ti, Fe, Sn, Al, Cr, Ni, Mn and Zn ions may be used as the etching agent to depolymerize (break silicon oxygen bonds) the surface of disk substrate 400. Acid or base etchant solutions (without metal etchant) may be used as the etchant in lieu of metal etchant. In this case, metal ions from the substrate composition will be present in slurry 700 for the superpolish process. It should be understood, however, that the particular etching agent used varies with the type of substrate involved. Preferably, $Ce^{+4}$ and/or $Fe^{+3}$ ions are used as the etching agent if disk substrate 400 is glass. The $Ce^{+4}$ ions may be provided from cerium sulfate tetrahydrate ($Ce(SO_4)_2 4H_2O$), for example. The $Fe^{+3}$ ions may be provided from ferric chloride hexahydrate ($FeCl_3 6H_2O$) and/or ferric sulfate nonahydrate ($Fe_2(SO_4)_3 9H_2O$), for example. The etchant may be present in solution or as a colloid or as an ion on the colloidal particles.

In addition, the pH of slurry 700 is typically adjusted to be acidic by adding acid or basic by adding caustic agent. For example, if slurry 700 contains colloidal silica with nonionic and/or non-quaternary amine cationic surfactant the preferable pH range is pH 0 to 4; more preferably pH 0.8 to 3.0; and most preferably pH 1.0 to 2.0. It should be understood, however, that the preferable pH range is dependent on the specific substrate and colloid surfaces used (e.g., different surface types need different pH's, thus a surface treatment of the colloid such as coating silica with alumina ions, shifts the pH's of the useful and stable ranges, both the isoelectric point of the surface and the materials solubility are involved) and the surfactant or surfactants used will be a function of the substrate surface, colloid surface and pH or can be a factor in pH selection. In fact, it may be desirable to make slurry 700 anywhere within the pH range of pH 0 to 12 depending on the glass, colloid type, and surfactant. For example, if slurry 700 contains colloidal alumina or alumina coated silica colloid with surfactant the preferable pH range is pH 3.5 to 10.5. On the other hand, if slurry 700 contains colloidal silica with a quaternary amine cationic surfactant, the preferable pH range is pH 7 to 12 and/or at a pH that for the substrate or colloid is around or higher in pH than its isoelectric point. Stock removal rate generally goes down with increases in pH on aluminosilicate glass substrates until silica dissolution becomes significant around pH 11–12.

If disk substrate 400 is glass, for example, acids such as sulfamic ($H_3NSO_3$), nitric ($HNO_3$) and sulfuric acid ($H_2SO_4$) may be used to adjust the pH to be acidic. It should be understood, however, that the particular acid or caustic agent used varies with the type of substrate involved. Useful acids generally include inorganic acids such as nitric acid, nitrous acid, sulfuric acid, sulfurous acid, sulfamic acid, phosphoric acid, pyrophosphoric acid, phosphorous acid, perchloric acid, hydrochloric acid, chlorous acid, hypochlorous acid, hydrofluoric acid, carbonic acid, chromic acid; as well as organic acids such as formic acid and citric acid. Useful caustic agents generally include inorganic bases such as lithium hydroxide, sodium hydroxide, potassium hydroxide, calcium hydroxide, and ammonium hydroxide.

It should be understood that the present invention is not limited to a particular etching agent, a particular acid/caustic agent, or a particular substrate type. Additionally, it should be understood that there will be an optimum pH value that varies depending upon the particular combination of substrate type, etching agent, surfactant, and colloid. When slurry 700 comes into contact with the surface of disk substrate 400, it reacts with the substrate and depolymerizes the surface such that it can be easily removed in combination with mechanical action.

Colloidal slurries, such as colloidal silica, are used on many different metal and alloy surfaces to polish to a smooth finish. Silica colloid, just as when used to polish glass, will bond to the surface oxides of metals leaving a silica contaminated surface. Using a self-cleaning colloidal slurry and process on other materials, where silica is not present or not the main component of the substrate requires additional considerations. The etchant ions to choose from are still the same (e.g., Ce, Zr, Ti, Fe, Sn, Al, Cr, Ni, Mn and Zn ions) but the selection of the best etchant ion depends on the corrosion stable pH range of the substrate, the anion effects on corrosion and which ion gets left from the self-cleaning colloidal slurry at very low concentrations could pose a problem. Alternatively, acid or base etchant solutions (without metal etchant) may be used as the etchant in lieu of metal etchant. Such acid or base etchant solutions include the useful acids and caustic agents listed above with respect to pH adjustment.

Colloidal Particles for Substrate Material Removal

As the surface of disk substrate 400 is depolymerized, soft colloidal particles add mechanical action for a synergistic chemical mechanical polish (CMP). Use of large colloidal particles for polishing leaves a rougher surface finish on the disk substrate. Hence, the smaller the particles the better for superfinishing. However, the smallest colloidal particles have low stock removal rates. Hard colloidal particles (as fumed silica) are ineffective because they leave a scratched or rougher surface. For these reasons, soft colloidal particles of intermediate size are preferred for slurry 700. The colloidal particles preferably have a nominal particle size in the range of 2 to 200 nm. The size of the colloidal particles is typically selected based on the desired surface finish and the desired stock removal rate. The smaller the colloidal particle size the smoother the surface finish and the slower the stock removal rate. Likewise, the concentration of the colloidal particles is typically selected based on the desired stock removal rate and cost. Smaller particles require higher concentrations to achieve cutting rates equivalent to larger particles.

Preferably, the colloidal particles are soft colloidal silica (as opposed to hard fumed silica), e.g., Ludox SM (colloidal silica made and dispersed in water, which is available from Grace Davidson and has spherical colloidal silica particles having a nominal size of 70 Å). While the type of colloidal particle used in the preferred embodiment is colloidal silica, it should be appreciated that the present invention is not limited to the particular type of colloidal particle used in the preferred embodiment. Other inorganic colloidal particles may be used, such as colloidal alumina. Likewise, it should be appreciated that the present invention is not limited to the particular size and concentration of colloidal particle used in the preferred embodiment.

Surfactant for Steric Hindrance Barrier

Slurry 700 also includes at least one surfactant that is adsorbed onto the surface of disk substrate 400 and/or the surface of the colloidal particles at the pH used. The surfactant has a hydrophobic section that forms a steric hindrance barrier between substrate 400 and the colloidal particles. This hydrophobic "tail" section of the surfactant has less affinity for the colloidal particles and/or disk substrate than it does for the carrying fluid of the slurry. The steric hindrance barrier prevents the colloidal particles from ever bonding to the surface of disk substrate 400 in the first place. The steric hindrance barrier takes away molecular bonding, acid/base bonding, hydrogen bonding, and some or all of the van der Walls forces (amount depends on the surfactant composition and structure chosen) for the colloidal particles sticking to the surface of disk substrate 400. This allows conventional soap-based cleaning of disk substrate 400 and removes the requirement for special and expensive extra cleaning steps, such as etching (undercutting) or micropolishing or polish etch, or combinations thereof.

Nonionic and cationic surfactants that work in acidic colloidal silica slurry to form a steric hindrance barrier include oxygen containing compounds with moieties such as ethylene oxide (e.g., ethylene oxide propylene oxide block copolymer) and polyvinyl alcohol, and nitrogen containing compounds such as alkaloids and amines. Both types of surfactants must also have a hydrophobic section of the compound to help form the steric hindrance barrier. Polydentate adsorption surfactants are preferred.

Another type of steric barrier can also be used, made by precipitating an anionic surfactant on the substrate and/or colloidal surfaces (e.g., sodium octyl sulfate at pH <7 and/or at a pH that for the substrate or colloid is around or lower in pH than its isoelectric point). This later gets removed during the cleaning process with a change in the pH to >7 and/or greater than the isoelectric point of the coated surface.

The polar section of the surfactant attaches by coulombic forces to the surface of the disk substrate and/or colloidal particles, while the hydrophobic section of the surfactant projects into the slurry solution. The coulombic forces are activated by the hydrogen protons (acidic pH) or the etchant acting on the surface of the disk substrate and/or colloidal particles. As mentioned above, the etchant is present in the slurry solution or as colloidal particles or as an ion on the colloidal silica. Attachment of polar sections of the surfactant to the surface of the disk substrate and/or colloidal particles is thermodynamically favored at the pH of the slurry. For example, an anionic (negatively charged) constituent of the polar section (e.g., O in the case of oxygen containing nonionic surfactants such as ethylene oxide and N in the case of nitrogen containing nonionic surfactants such as alkaloids) is attracted to the surface of the disk substrate and/or colloidal particles which are made protonic (positively charged) by the acid pH or the etchant. The hydrophobic section of the surfactant, on the other hand, has less affinity for the colloidal particles and/or disk substrate than it does for the carrying fluid of the slurry. Also, the degree of match between the surfactant's electron donor atomic spacing and that of the surface of the disk substrate and/or colloidal particles active positive charge sites has an impact on the effectiveness of the steric hindrance barrier.

One type of commercially available surfactant that may be used in colloidal silica slurry to form a steric hindrance barrier is Corsheen CorAdd 9195 available from the Coral Chemical Company (Paramount, Calif.). Corsheen CorAdd 9195 is a proprietary compound of Coral Chemical Company, but is believed to be an ethylene oxide propylene oxide block copolymer plus alkaloid component. There are numerous other commercial surfactants available, many of which are believed to work in colloidal slurries to form a steric hindrance barrier. Some commercially available surfactants tested include:

Amberclean SCA24 available from Innovative Organics, Anaheim, Calif.;

PAA (poly acrylic acid of molecular weight 2000) available from Aldrich, Milwaukee, Wis.;

Corsheen—190 available from Coral Chemical Co., Paramount, Calif.;

Corsheen—191 available from Coral Chemical Co., Paramount, Calif.;

TRITON X-100 available from Union Carbide Corp., Charleston, W.Va.;

Valtron SP2201 available from Valtech Corp, Pughtown, Pa.;

Corsheen CorAdd 9192LF (has ethylene oxide and propylene oxide groups) available from Coral Chemical Co., Paramount, Calif.;

Amberclean L20 available from Innovative Organics, Anaheim, Calif.;

Glycol (has alcohol groups on adjacent carbons) available from Aldrich, Milwaukee, Wis.;

SOLSPERSE 2000 (has amine groups with hydrocarbon backbone) available from ICI Americas Inc.;

BRIJ 30 available from ICI Americas Inc.;

BRIJ 99 available from ICI Americas Inc.;

Morclean GC 12 (unknown composition) available from Oakite Products, Berkeley Heights, N.J.;

Tamol 960 available from Rohm & Haas Co., Philadelphia, Pa.

Table 4 below sets forth the effectiveness of the above-listed commercially available surfactants in changing a glass surface to a hydrophobic character in water. The first column lists the surfactant, the second column lists the pH of the surfactant solution and whether surface water sheets off or beads off at 23 C after soaking for 10 min., the third column lists whether surface water sheets off or beads off at 23 C when the pH of the surfactant solution is adjusted to 2.5 with $HNO_3$ after soaking for 10 min., and the fourth column lists whether surface water sheets off or beads off at 60 C when the pH of the surfactant solution is adjusted to 2.5 with $HNO_3$ after soaking for 10 min. "Sheets Off" means the surface stayed water wetted and the film drained down when held vertical. "Beads Off" means the surface water formed beads and left the surface as droplets. "Beads Off" indicates that the surfactant is relatively more effective in changing the glass surface to a hydrophobic character in water.

TABLE 4

| SURFACTANT and its SOLUTION pH | Step A - Surfactant Solution pH 23 C. 10 min. | Step B - pH 2.5 with $HNO_3$ 23 C. 10 min. | Step C - pH 2.5 with $HNO_3$ 60 C. 10 min. |
|---|---|---|---|
| Amberclean SCA24 | 2.66/Sheets Off | Sheets Off | Sheets Off |
| PAA 2000 MW | 3.25/Sheets Off | Sheets Off | Sheets Off |
| Corsheen - 190 | 4.47/Sheets Off | Sheets Off | Sheets Off |
| Corsheen - 191 | 4.56/Sheets Off | Sheets Off | Sheets Off |
| TRITON X-100 | 5.42/Sheets Off | Sheets Off | Sheets Off |
| Valtron SP2201 | 10.61/Sheets Off | Sheets Off | Sheets Off |
| Corsheen CorAdd 9192LF | 4.58/Sheets Off | Sheets Off | Beads Off |
| Amberclean L20 | 11.62/Sheets Off | Sheets Off | Sheets Off |
| Glycol | 5.04/Sheets Off | Sheets Off | Beads Off |
| SOLSPERSE 2000 | 10.29/Sheets Off | Beads Off | Beads Off |
| BRIJ 30 | 4.78/Sheets Off | Sheets Off | Sheets Off |
| BRIJ 99 | 4.98/Sheets Off | Sheets Off | Sheets Off |
| Morclean GC 12 | 9.97/Sheets Off | Sheets Off | Beads Off |
| Tamol 960 | 8.35/Sheets Off | Sheets Off | Sheets Off |

EXAMPLES

Example 1

A two bath stripping operation was used to completely remove the sputtered magnetic recording layer from 95 mm data storage disks having aluminosilicate glass substrate. The glass data storage disks were initially immersed in a first bath of a dilute aqua regia soak (i.e., 75 vol. % DI water, 20 vol. % hydrochloric acid and 5 vol. % nitric acid) at room temperature for about 20 minutes. Then, the glass data storage disks were immersed in a second bath of a dilute bleach/acid soak (i.e., 90 vol. % DI water, 5 vol. % bleach and 5 vol. % hydrochloric acid) at room temperature for about 20 minutes. Following the two bath stripping operation, the stripped disks were rinsed free of sputter layer debris, sorted into 2 micron thickness groups, and were ready for polishing.

Next, a self-cleaning slurry was made from two solutions. Solution A was first made by placing 13.6 grams of cerium sulfate tetrahydrate ($Ce(SO_4)_2 4H_2O$ MW 404.31) and 240 grams of sulfamic acid ($H_3NSO_3$ MW 97.1) in a beaker and adding 1200 ml of deionized (DI) water and stirring at room temperature (RT) until dissolved. Solution B was made by pouring 1840 ml DI water into 4480 ml of Ludox SM with stirring, and then stirring a mixture of 6.4 grams of Corsheen CorAdd 9195 and 480 ml DI water into that. Both Solution A and Solution B were then put through a 0.1 micron filter to remove any particles that might cause scratching. Solution B was then poured into Solution A over a 5 second period with strong mixing to form the self-cleaning slurry. The final pH of the self-cleaning slurry was 1.2, while its final volume 8 liters.

The self-cleaning slurry was used to polish and superfinish the stripped aluminosilicate glass disks of one of the 2 micron thickness groups on a polishing machine having a controller for controlling the relative velocity of the polishing pads as seen by the stripped disks so that a substantially equal amount of stock was removed from each side of the stripped disks (i.e., 1 micron was removed from each side). The controller adjusted the speed of rotation of the sun gear and the ring gear so that the relative velocity of the upper polishing pad as seen by the stripped disks was substantially equal to the relative velocity of the lower polishing pad as seen by the stripped disks. The speed of the upper polishing pad was 35 rpm, and the lower polishing pad was stationary. The upper and lower polishing pads were Napcon H7000SPH#2 polishing pads made by Fujibo. The down pressure was 1.0 psi-disk and the polishing time was about 12 minutes. The slurry temperature was 20–35 C and was introduced onto the stripped disks at a rate of 100 ml per minute.

After coming off the polishing machine, the reclaimed disk substrates were subjected to the conventional soap-based cleaning process set forth in Table 2 above. The conventional soap-based cleaning process completely removed the remaining slurry material leaving the surface of the reclaimed disk substrates free from contamination as seen by AFM. The reclaimed disk substrates had very low roughness, low waviness and low roll-off.

Example 2

In this example, the previous example was repeated but with a different self-cleaning slurry. Again, the self-cleaning slurry was made from two solutions. Solution A was first made by placing 216.4 grams of ferric chloride hexahydrate ($FeCl_3 6H_2O$ MW 270.3) and 160 grams of sulfamic acid ($H_3NSO_3$ MW 97.1) in a beaker and adding 1200 ml of deionized (DI) water and stirring at room temperature (RT) until dissolved. Solution B was made by pouring 1840 ml DI water into 4480 ml of Ludox SM with stirring, and then stirring a mixture of 6.4 grams of Corsheen CorAdd 9195 and 480 ml DI water into that. Both Solution A and Solution B were then put through a 0.1 micron filter to remove any particles that might cause scratching. Solution B was then poured into Solution A over a 5 second period with strong mixing to form the slurry. The final pH of the slurry was 1.2, while its final volume 8 liters.

As in the previous example, the conventional soap-based cleaning process completely removed the remaining slurry material leaving the surface of the reclaimed disk substrates free from contamination as seen by AFM. The reclaimed disk substrates of this example also had very low roughness, low waviness and low roll-off.

Example 3

In this example, the previous examples were repeated but with a different self-cleaning slurry. Again, the self-cleaning slurry was made from two solutions. Solution A was first made by placing 1600 ml of DI water in a beaker and adding 140 ml of 50% nitric acid ($HNO_3$) and stirring in 56.4 grams ferric sulfate nonahydrate ($Fe_2(SO_4)_3 9H_2O$ MW 562.0) until dissolved. Solution B was made by pouring 1300 ml DI water into 4480 ml of Ludox SM with stirring, and then stirring a mixture of 6.4 grams of Corsheen CorAdd 9195 and 480 ml DI water into that. Both Solution A and Solution B were then put through a 0.1 micron filter to remove any particles that might cause scratching. Solution B was then poured into Solution A over a 5 second period with strong mixing to form the slurry. The final pH of the slurry was 1.2, while its final volume 8 liters.

As in the previous examples, the conventional soap-based cleaning process completely removed the remaining slurry material leaving the surface of the reclaimed disk substrates free from contamination as seen by AFM. The reclaimed disk substrates of this example also had very low roughness, low waviness and low roll-off.

Example 4

In this example, the previous examples were repeated but with a different self-cleaning slurry. Again, the self-cleaning slurry was made from two solutions. Solution A was first made by placing 13.6 grams of cerium sulfate tetrahydrate ($Ce(SO_4)_2 4H_2O$ MW 404.31) in a mixture of 50% sulfuric acid and 216 ml of DI water in a beaker and heating to 90–100 C until dissolved, then cooling to less than 40 C and adding 600 ml DI water with stirring. Solution B was made by pouring 2120 ml DI water into 4480 ml of Ludox SM with stirring, and then stirring a mixture of 6.4 grams of Corsheen CorAdd 9195 and 480 ml DI water into that. Both Solution A and Solution B were then put through a 0.1 micron filter to remove any particles that might cause scratching. Solution B was then poured into Solution A over a 5 second period with strong mixing to form the slurry. The final pH of the slurry was 1.2, while its final volume 8 liters.

As in the previous examples, the conventional soap-based cleaning process completely removed the remaining slurry material leaving the surface of the reclaimed disk substrates free from contamination as seen by AFM. The reclaimed disk substrates of this example also had very low roughness, low waviness and low roll-off.

While this invention has been described with respect to the preferred and alternative embodiments, it will be understood by those skilled in the art that various changes in detail may be made therein without departing from the spirit, scope, and teaching of the invention. For example, the invention may also be utilized in other data storage medium applications, such as in optical storage medium applications. Accordingly, the herein disclosed invention is to be limited only as specified in the following claims.

What is claimed is:

1. A process of reclaiming a disk substrate for use in a data storage device, comprising the steps of:

providing a disk having at least one layer coated on a top and a bottom surface thereof;

stripping at least a portion of the at least one layer from the said surfaces of the disk by immersing the disk in a bath comprising water, hydrochloric acid and nitric acid;

polishing the stripped disk by placing the stripped disk in a carrier between an upper polishing pad and a lower polishing pad and controlling the relative velocity of the polishing pads as seen by the stripped disk so that a substantially equal amount of stock is removed from each of said surfaces of the stripped disk;

cleaning the polished disk.

2. The process as recited in claim 1, wherein the bath includes about 20 vol. % hydrochloric acid and about 5 vol. % nitric acid.

3. The process as recited in claim 2, wherein the disk is immersed in the bath for about 20 minutes while the bath is at about room temperature.

4. The process as recited in claim 1, wherein the stripping step includes immersing the disk in a bath of dilute aqua regia.

5. The process as recited in claim 1, wherein the step of stripping includes immersing the disk in a first bath comprising water, hydrochloric acid and nitric acid, and subsequently immersing the disk in a second bath comprising water, bleach and hydrochloric acid.

6. The process as recited in claim 5, wherein the first bath includes about 20 vol. % hydrochloric acid and about 5 vol. % nitric acid, and the second bath includes about 5 vol. % bleach and about 5 vol. % hydrochloric acid.

7. The process as recited in claim 6, wherein the disk is immersed in the first bath for about 20 minutes while the first bath is at about room temperature, and the disk is immersed in the second bath for about 20 minutes while the second bath is at about room temperature.

8. The process as recited in claim 1, wherein the disk is a glass data storage disk and the at least one layer is a sputtered magnetic recording layer.

9. The process as recited in claim 1, wherein the polishing step employs a self-cleaning colloidal slurry.

10. The process as recited in claim 1, wherein the lower polishing pad is stationary, the upper polishing pad is rotated at a predetermined speed, and the carrier is rotated and orbited between a sun gear and a ring gear so that the relative velocity of the upper polishing pad as seen by the stripped disk is substantially equal to the relative velocity of the lower polishing pad as seen by the stripped disk, whereby a substantially equal amount of stock is removed from said surface of the stripped disk.

11. The process as recited in claim 10, wherein the predetermined speed of the upper polishing pad is between about 30 rpm and about 58 rpm.

12. The process as recited in claim 11, wherein a down pressure of the upper polishing pad on the stripped disk is about 0.7 psi to about 1.5 psi.

13. The process as recited in claim 10, wherein the polishing step employs a self-cleaning colloidal slurry, the predetermined speed of the upper polishing pad is about 35 rpm, and a down pressure is about 1.0 psi.

14. The process as recited in claim 9, wherein the cleaning step comprises treating the polished disk in standard soap solutions.

15. A process of reclaiming a plurality of disk substrates for use in a data storage device, comprising the steps of:
providing a plurality of glass disks, each having at least one layer coated on a top and a bottom surface thereof;
stripping at least a portion of the at least one layer from the said surfaces of the disks immersing the disks in a bath comprising water, hydrochloric acid and nitric acid;
sorting the stripped disks into a plurality of groups based on disk thickness;
simultaneously polishing a plurality of the sorted disks from a selected one of the groups by placing the plurality of the sorted disks from the selected group in a carrier between an upper polishing pad and a lower polishing pad and controlling the relative velocity of the polishing pads as seen by the sorted glass so that a substantially equal amount of stock is removed from each of said surfaces of the sorted disks;
cleaning the polished disks.

16. The process as recited in claim 15, wherein the sorting step includes sorting the stripped disks into groups each having a range of disk thicknesses of less than or equal to about 2 microns.

17. The process as recited in claim 10, further comprising the step of:
ordering the polished disks in a cassette for stacking in a data storage device based on disk thickness.

18. The process as recited in claim 17, wherein the ordering step includes placing polished disks having a disk thickness larger than a first predetermined thickness in one of odd or even cassette positions and placing polished disks having a disk thickness smaller than a second predetermined thickness in the other of odd or even cassette positions.

19. A process of reclaiming a plurality of disk substrates for use in a data storage device, comprising the steps of:
providing a plurality of disks, each having at least one layer coated on a top and a bottom surface thereof;
stripping at least a portion of the at least one layer from said surfaces of the disks; immersing the disks in a bath comprising water, hydrochloric acid and nitric acid;
polishing a plurality of the stripped disks by placing a plurality of the stripped disks in a carrier between an upper polishing pad and a lower polishing pad and controlling the relative velocity of the polishing pads as seen by the stripped disks so that a substantially equal amount of stock is removed from each of said surfaces of the stripped disks;
ordering the polished disks in a cassette for stacking in a data storage device based on disk thickness;
cleaning the polished disks.

20. The process as recited in claim 19, wherein the ordering step includes placing polished disks having a disk thickness larger than a first predetermined thickness in one of odd or even cassette positions and placing polished disks having a disk thickness smaller than a second predetermined thickness in the other of odd or even cassette positions.

* * * * *